(12) United States Patent
Herberholz

(10) Patent No.: US 8,976,506 B2
(45) Date of Patent: Mar. 10, 2015

(54) METAL-ON-METAL CAPACITOR WITH DIAGONAL FEEDLINE

(75) Inventor: Rainer Herberholz, Cambridge (GB)

(73) Assignee: Cambridge Silicon Radio Ltd. (GB)

( * ) Notice: Subject to any disclaimer, the term of this patent is extended or adjusted under 35 U.S.C. 154(b) by 1 day.

(21) Appl. No.: 13/123,676

(22) PCT Filed: Sep. 14, 2009

(86) PCT No.: PCT/GB2009/051184
§ 371 (c)(1),
(2), (4) Date: Apr. 11, 2011

(87) PCT Pub. No.: WO2010/046673
PCT Pub. Date: Apr. 29, 2010

(65) Prior Publication Data
US 2011/0199715 A1  Aug. 18, 2011

(30) Foreign Application Priority Data
Oct. 21, 2008  (GB) .................................. 0819227.0

(51) Int. Cl.
| | |
|---|---|
| H01G 4/06 | (2006.01) |
| H01G 4/005 | (2006.01) |
| H01G 4/228 | (2006.01) |
| H01G 4/236 | (2006.01) |
| H01G 2/20 | (2006.01) |
| H01L 49/02 | (2006.01) |
| H01L 23/522 | (2006.01) |

(Continued)

(52) U.S. Cl.
CPC ............ *H01L 28/91* (2013.01); *H01L 23/5223* (2013.01); *H01L 27/0207* (2013.01); *H01L 27/0805* (2013.01); *H01L 28/87* (2013.01); *H01L 2924/3011* (2013.01)
USPC ........ 361/313; 361/303; 361/306.1; 361/307; 361/311; 361/308.1

(58) Field of Classification Search
USPC ........... 361/303, 306, 307, 311, 308.1, 306.1, 361/313
See application file for complete search history.

(56) References Cited

U.S. PATENT DOCUMENTS

| | | |
|---|---|---|
| 5,208,725 A | 5/1993 | Akcasu |
| 5,583,359 A | 12/1996 | Ng et al. |
| 7,013,436 B1 | 3/2006 | Morton et al. |

(Continued)

OTHER PUBLICATIONS

WIPO, International Preliminary Report on Patentability of PCT Application No. PCT/GB2009/051184, Apr. 26, 2011, 8 pages.

(Continued)

*Primary Examiner* — Eric Thomas
*Assistant Examiner* — Arun Ramaswamy
(74) *Attorney, Agent, or Firm* — John W. Branch; Lowe Graham Jones PLLC

(57) ABSTRACT

A design for an improved metal-on-metal capacitor design is described. The design includes a substantially diagonal feedline (411, 412, 413) in each metal layer. Each metal layer (21, 22, 23) comprises two sets of metal fingers which are interleaved. Each set of fingers comprises two subsets of fingers and the subsets of fingers are arranged at right angles to each other. Fingers in a first of the two sets are all connected to the diagonal feedline, while fingers in the other set are connected together via fingers at the periphery of the device. The design is repeated in adjacent layers, where the design may be identical or rotated (e.g by 180°) between adjacent metal layers.

16 Claims, 5 Drawing Sheets

(51) Int. Cl.
*H01L 27/08* (2006.01)
*H01L 27/02* (2006.01)

(56) References Cited

U.S. PATENT DOCUMENTS

| | | | |
|---|---|---|---|
| 8,014,125 B2* | 9/2011 | Drapkin et al. | 361/311 |
| 2004/0031982 A1 | 2/2004 | Devries et al. | |
| 2004/0159941 A1 | 8/2004 | Yoshikuni | |
| 2005/0077581 A1 | 4/2005 | Chang et al. | |
| 2005/0128038 A1 | 6/2005 | Hyvonen | |
| 2006/0163692 A1 | 7/2006 | Detecheverry et al. | |
| 2007/0123015 A1* | 5/2007 | Chinthakindi et al. | 438/597 |
| 2007/0126078 A1* | 6/2007 | Huang et al. | 257/532 |
| 2007/0228520 A1 | 10/2007 | Winn et al. | |
| 2007/0235838 A1* | 10/2007 | Wang | 257/532 |
| 2007/0279835 A1 | 12/2007 | Chinthakindi | |
| 2008/0012092 A1* | 1/2008 | Liang et al. | 257/532 |
| 2008/0158772 A1 | 7/2008 | Hsien et al. | |
| 2008/0237792 A1* | 10/2008 | Kang et al. | 257/532 |

OTHER PUBLICATIONS

Roberto Aparicio et al., Capacity Limits and Matching Properties of Integrated Capacitors, IEEE J. Solid State Circuits, vol. 37, 2002, p. 384.

Mikhail Popovich, High Performance Power Distribution Networks with On-Chip Decoupling Capacitors for Nanoscale Integrated Circuits, Thesis, University of Rochester, New York, 2007, 370 pages.

Hirad Samavati et al., Fractal Capacitors, IEEE J. Solid State Circuits, vol. 33, 1998, p. 2035.

\* cited by examiner

METAL-ON-METAL CAPACITOR WITH DIAGONAL FEEDLINE

BACKGROUND

High quality capacitors are required in the design of mixed signal and RF circuits to compensate for the limited quality of on-chip inductors in resonators or to provide decoupling (to prevent RF coupling on power or ground lines). Metal-on-metal (MOM) capacitors are often used and these are built using standard IC-interconnect layers. These capacitors may also be referred to as metal-metal comb or fringing capacitors.

Current capacitor designs include Manhattan-style capacitors with all conduction paths at right angles, as shown in FIG. 1, which comprise woven fingers of metal 101 in each layer 102, 103 and Vertical Parallel Plate (VPP) capacitors. Fractal capacitors have also been proposed which randomize the orientation and shorten the length of the current paths in the device.

The embodiments described below are not limited to implementations which solve any or all of the disadvantages of known metal-on-metal capacitors.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A design for an improved metal-on-metal capacitor design is described. The design includes a substantially diagonal feedline in each metal layer. Each metal layer comprises two sets of metal fingers which are interleaved. Each set of fingers comprises two subsets of fingers and the subsets of fingers are arranged at right angles to each other. Fingers in a first of the two sets are all connected to the diagonal feedline, whilst fingers in the other set are connected together via fingers at the periphery of the device. The design is repeated in adjacent layers, where the design may be identical or rotated by 180° between adjacent metal layers.

A first aspect provides a metal-on-metal capacitor cell design comprising a plurality of metal layers, each metal layer comprising a design comprising: two interdigitated sets of fingers, wherein each set of fingers comprises a first subset of fingers and a second subset of fingers and wherein fingers in the first subset are substantially perpendicular to fingers in the second subset; and an angled feedline to which the first set of fingers are connected.

The angled feedline may comprise a substantially diagonal feedline.

The angled feedline may be wider than any of the fingers.

The design may be rotated by 180° between adjacent metal layers.

The metal-on-metal capacitor cell design may further comprise a plurality of vias to provide connections between adjacent layers, said vias being located in fingers at a periphery of the cell.

A second aspect provides a metal-on-metal capacitor design comprising a plurality of cells as described above arranged such that adjacent cells are rotated by 90° and further comprising a top metal layer and a plurality of vias arranged to connect each of the plurality of cells.

The plurality of vias in the top metal layer may be aligned with the angled feedline.

A third aspect provides a metal-on-metal capacitor comprising a metal-on-metal capacitor design as described above and wherein adjacent metal layers are separated by a dielectric layer.

Further aspects provide a metal-on-metal capacitor substantially as described with reference to any of FIGS. 2-5 of the drawings and a metal-on-metal capacitor design substantially as described with reference to any of FIGS. 2-5 of the drawings.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
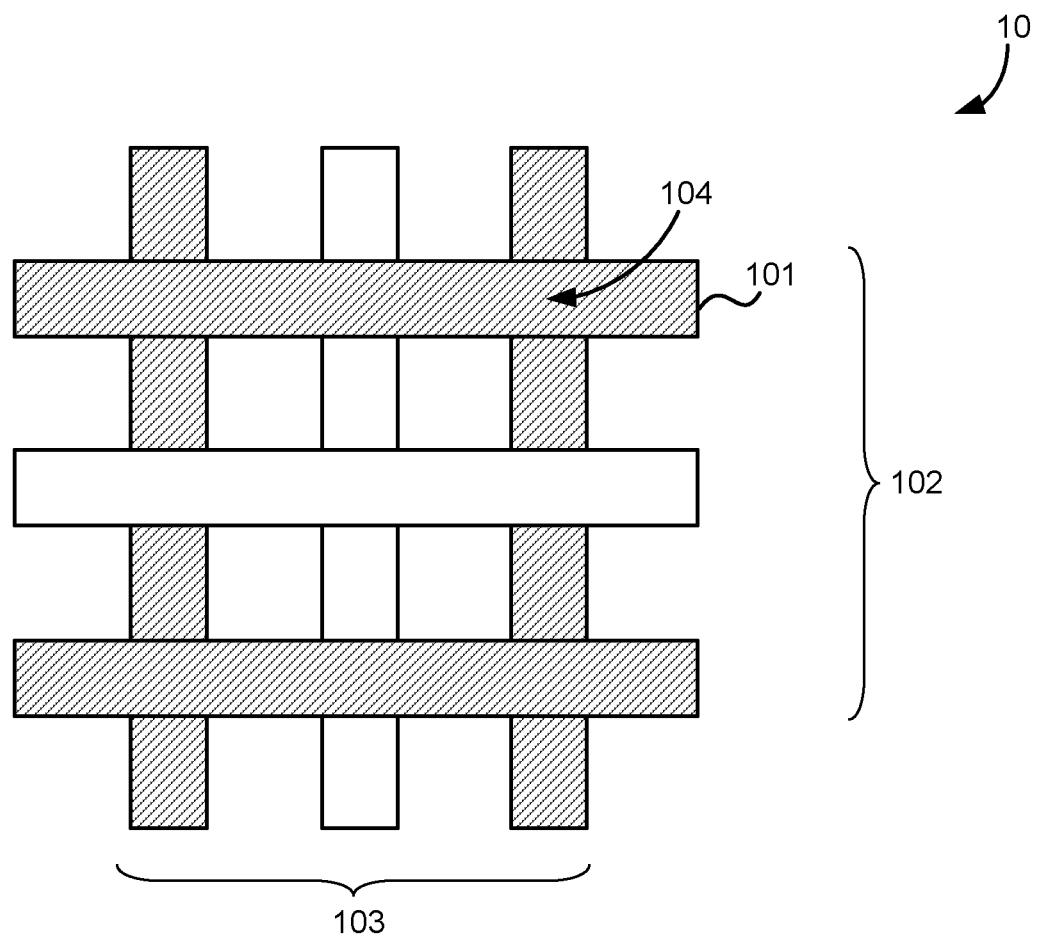
FIG. 1 is a schematic diagram of a Manhattan-style capacitor.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Many of the existing capacitor designs are not suited to fabrication using deep sub-100 nm silicon technology: the relative contribution from the inter-metal capacitance reduces at each node and some designs, such as VPP capacitors, are limited by time dependent dielectric breakdown (TDDB) sensitivity as a result of the vias along the metal fingers which are used to increase the capacitance density. Furthermore, fractal and quasi-fractal designs are largely unmanufacturable in sub-100 nm technologies if capacitance densities comparable to regular finger devices (e.g. Manhattan capacitors) are required. Woven MOM capacitors, which resemble the design shown in FIG. 1 with the addition of vias where the fingers in different layers overlap (e.g. at positions similar to the one indicated by arrow 104) are undesirable as although the resistance is reduced, the vias reduce the reliability of the devices (in a similar manner to VPP capacitors).

Figure 2:
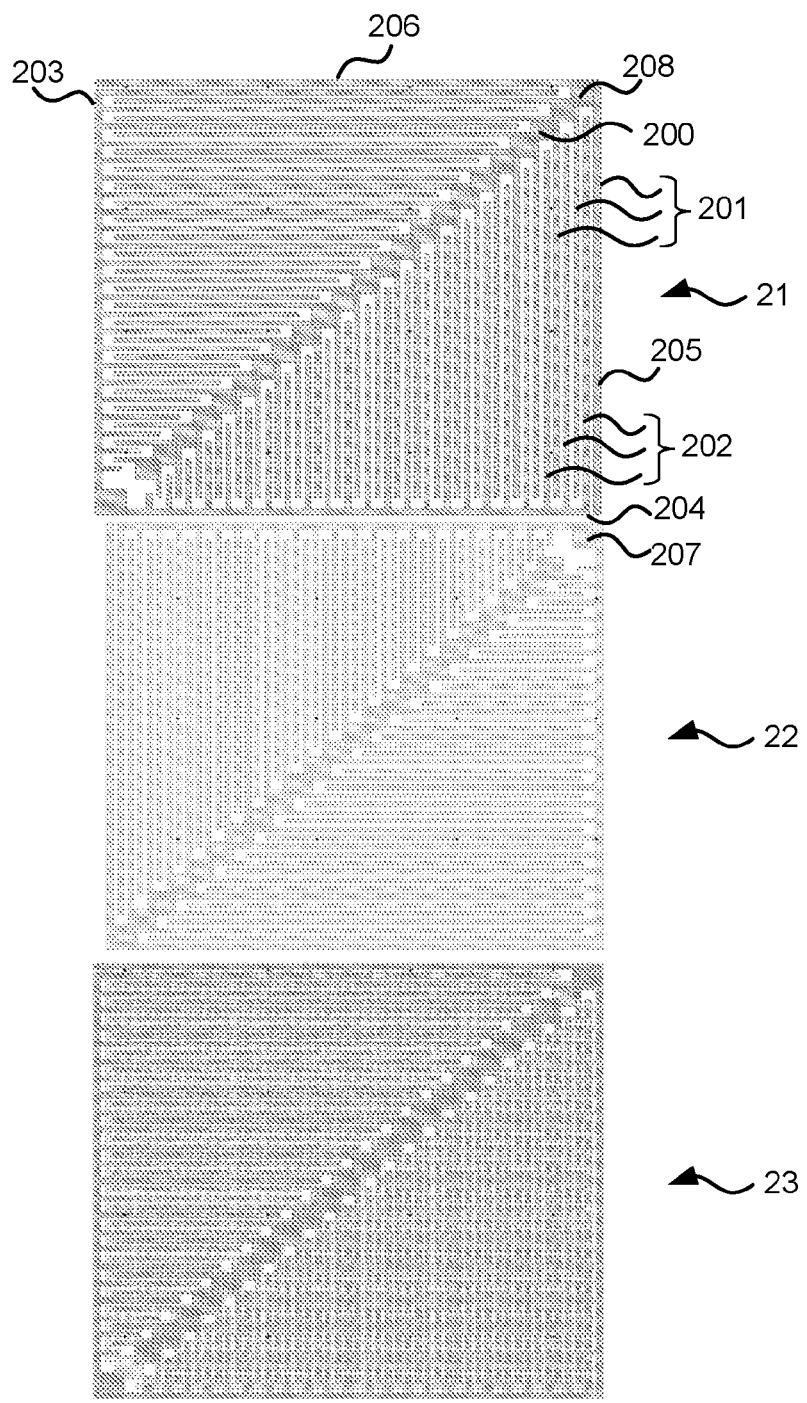
FIG. 2 shows a schematic diagram of an improved MOM capacitor design.

FIG. 2 shows a schematic diagram of an improved MOM capacitor design which includes a diagonal feedline 200. FIG. 2 shows the layout 21, 22 for two adjacent layers of metal (layer n and layer n+1) and the superposition 23 of these two layers. It can be seen that the layout for each layer is the same; however in this example the orientation of the design has been rotated by 180° between adjacent layers. In other examples, the orientation may be the same in adjacent layers or the design may be rotated by a different angle. It will be appreciated that these adjacent layers are separated by a dielectric layer and that vias are used to connect the layers, as discussed in more detail below.

The capacitor shown in FIG. 2 is formed using two inter-digitated (or interleaved) sets of fingers 201, 202 formed in each metal layer. The fingers are long and narrow and all the fingers within a set are connected together i.e. they form a single island of metal. The fingers 201 in the first set are all connected to the diagonal feedline 200 (i.e. they are integrally formed with the feedline), whilst the fingers 202 in the second set are all connected via fingers 203, 204 at the periphery of the capacitor. Within each set of fingers, a first subset of fingers is orientated at 90° (or substantially perpendicularly) to a second subset of fingers, although all fingers are located within the same plane—the plane of the metal layer from which the fingers are formed. The patterning of a metal layer may use known IC processing techniques.

Figure 3:
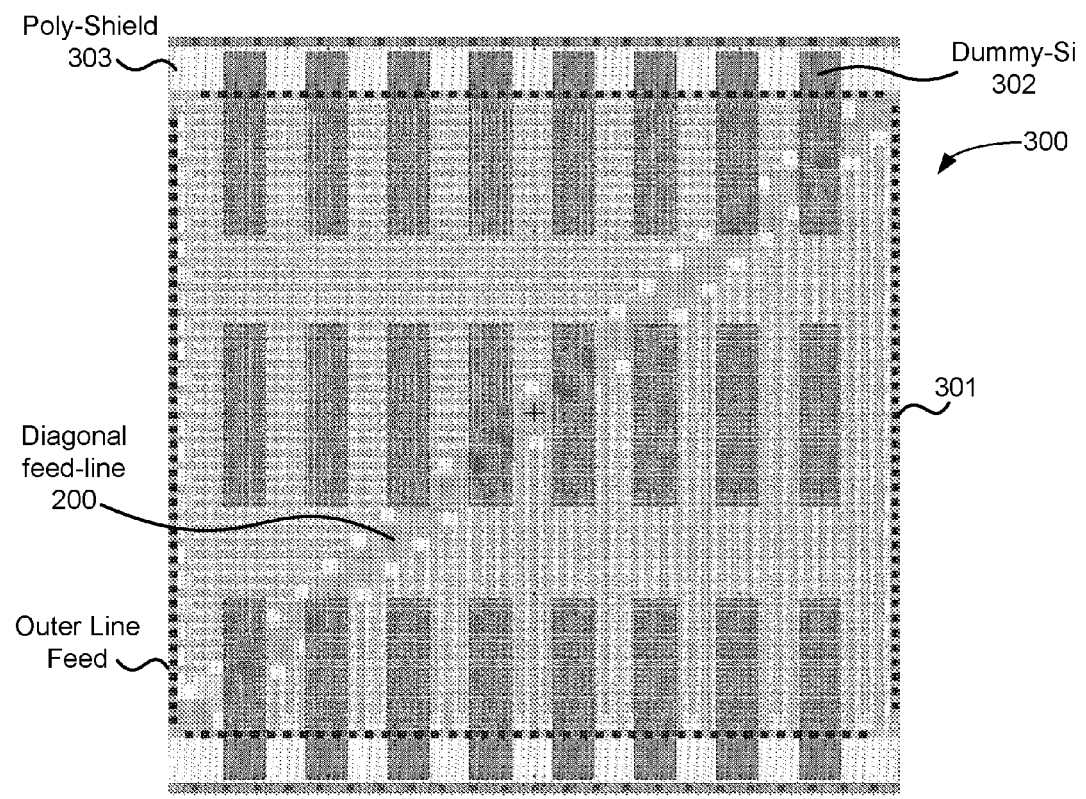
FIG. 3 shows an expanded view of a portion of FIG. 2.

The different layers of metal are connected together by vias 301 as shown in the larger view 300 of the superimposed layers in FIG. 3. These vias are located in fingers 203-206 around the periphery of the capacitor and in order to accommodate these vias, without compromising the reliability of the capacitor, the width of these fingers may be increased compared to the inner fingers. In an example implementation, these fingers at the periphery may be 20 nm wider than the inner fingers.

As shown in FIG. 2, the diagonal feedline 200 may be wider than any of the fingers in the capacitor. Use of a diagonal feedline which is wider than the fingers (e.g. the internal fingers or the peripheral fingers) reduces the overall series resistance of the device. However, in other variants, the diagonal feedline may be the same width as the internal and/or peripheral fingers (e.g. as shown in examples 401 and 402 in FIG. 4).

The design shown in FIG. 2 comprises at least one large area of metal 207, 208 attached to each set of fingers and located at a corner of the device. This large area of metal provides space for vias if required, although variants of FIG. 2 may omit this feature.

The improved capacitor design, as shown in FIG. 2, has reduced parasitic resistance and inductance. This increases the quality (Q) factor of the capacitor below the self-resonance frequency and also increases the self-resonance frequency for a particular capacitor in comparison to known Manhattan-style woven capacitors.

Although FIG. 2 shows a diagonal feedline at 45°, in further variants the feedline may be positioned at a different angle (e.g. as shown in examples 402 and 403 in FIG. 4) or may be substantially diagonal, e.g. at an angle of between 30° and 60°. Use of an angled feedline (e.g. a feedline at approximately 45°) reduces the average length of the narrow (and resistive) fingers within the capacitor which results in the performance improvements described above (e.g. the average length may be reduced by around 50%). In many examples, the angled feedline may pass through the centre of the capacitor although in other examples, the angled feedline may be offset from the centre (as shown in example 402 of FIG. 4).

FIG. 3 shows the use of dummy silicon 302 for manufacturability and poly-shield 303 which avoids the injection of signals into the substrate; however this is by way of example only and the capacitor design described above is independent of the use of dummy silicon and/or poly-shield. In some examples, other devices available in the IC process may be placed under the capacitor instead.

Figure 4:
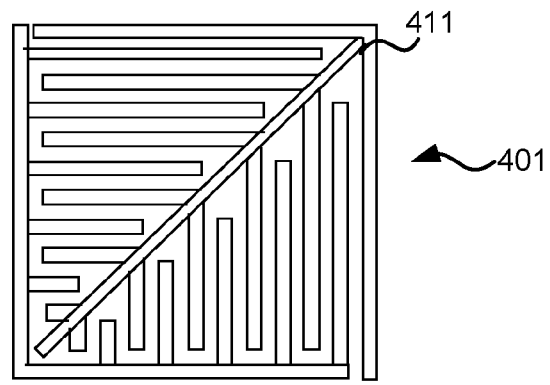
FIG. 4 shows schematic diagrams of further examples of improved MOM capacitor design.
Figure 4:
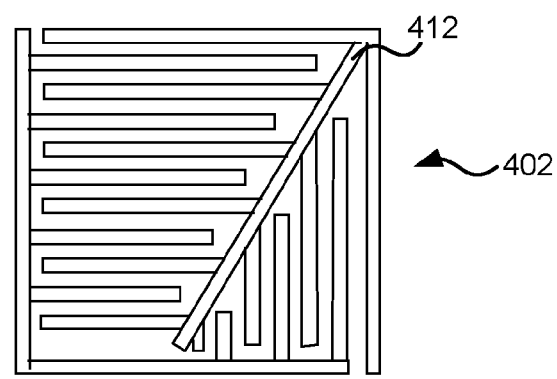
Figure 4:
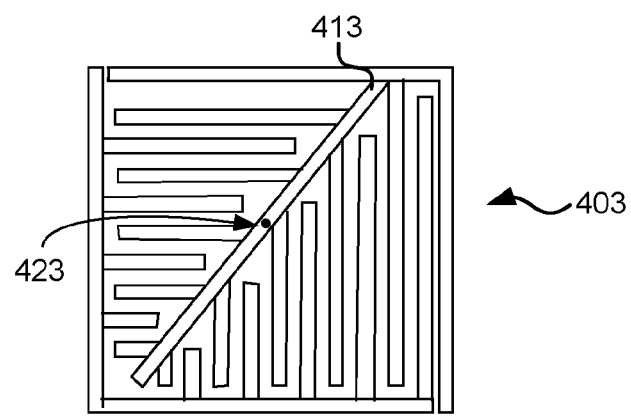

Whilst the designs shown in FIGS. 2 and 3 show a diagonal feedline which is constructed using squares (i.e. such that the feedline comprises edges of metal which are parallel to one of the edges of the device), in other examples, angled metal edges may be used, e.g. as shown in the simplified schematic diagrams of FIG. 4. FIG. 4 shows three examples, one which includes a diagonal feedline 411 (example 401) and two which include an angled feedline 412, 413 (examples 402 and 403) which is not along the diagonal. In one example 402, the angled feedline 412 does not pass through the centre of the device (marked by arrow 423 in example 403).

The vias (e.g. via 301 in FIG. 3) in the improved MOM capacitor described herein may be selected to be of similar dimensions and located in similar positions to known capacitors in order that the reliability of the structure is unchanged. For example, the vias may be located in the fingers at the edges of the device and which may be slightly wider than the inner fingers. However, in other designs, the positions and/or dimensions of the vias may be changed or optimised.

The improved MOM capacitor design described herein provides a MOM capacitor which has a capacitance density which is comparable to a woven (Manhattan) capacitor and the design is compatible with sub-100 nm design rules and may be fabricated using standard IC processing.

Figure 5:
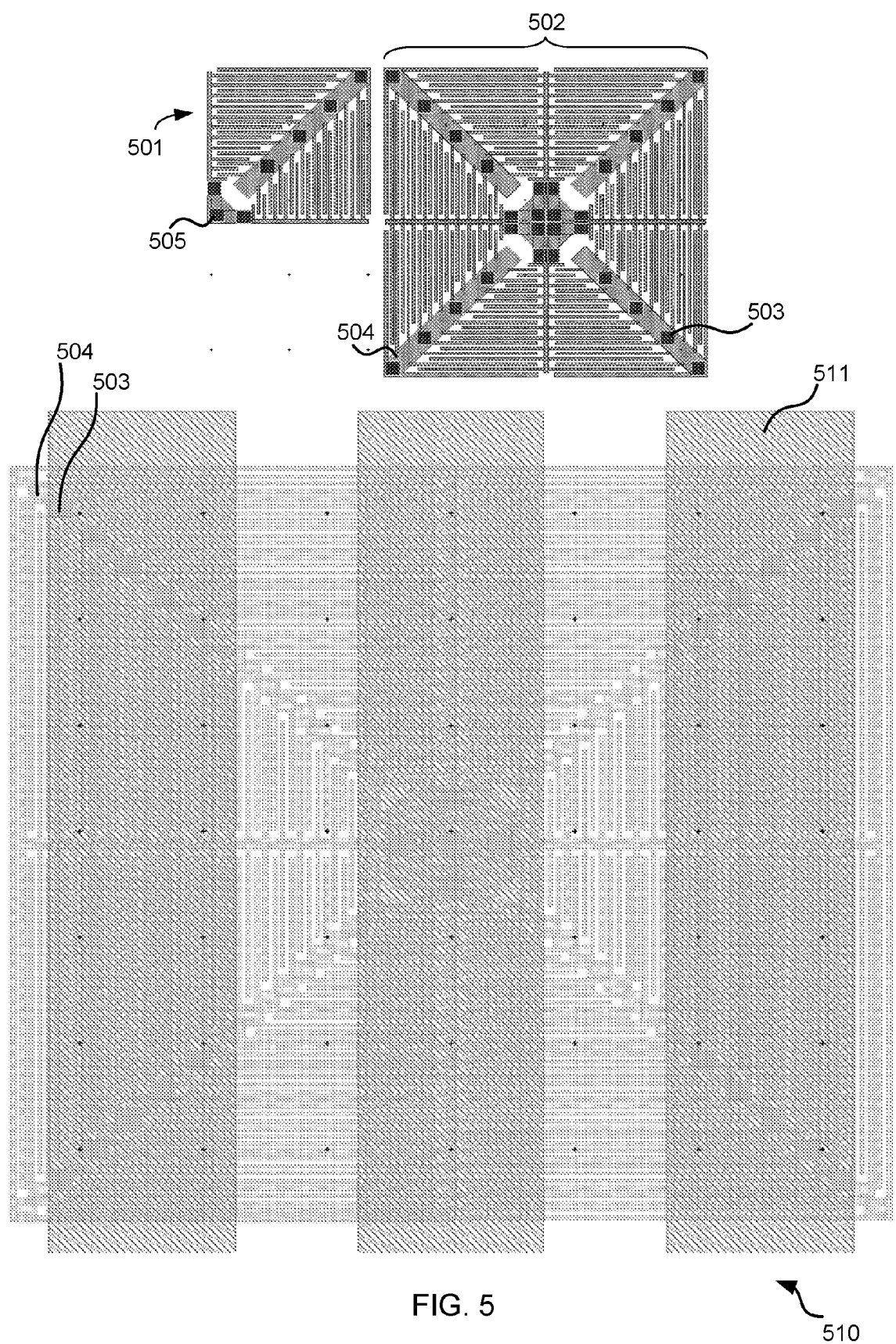
FIG. 5 shows a schematic diagram of a capacitor created by tiling individual capacitor cells.

As shown in FIG. 5, the design described above may provide a single cell 501 which may then be tiled, as shown in examples 502 and 510, to achieve a further reduction in finger length and/or to produce larger capacitors. Whilst the examples 502, 510 shows the cells 501 tiled with 90° rotation between adjacent tiles, this is not essential. Where single cells are tiled, a top metal layer 511 may be used to connect to the device using vias 503 onto the wider diagonal feedline 504 and/or vias 505 onto larger areas of metal at the corners of a cell and/or in the centre of the tiled design. The provision of a direct connection between the top metal layer and the MOM provides a very low impedance connection to the device without an area overhead. The wider diagonal (or angled) feedline enables this direct connection in an efficient manner, with minimum loss of capacitance density.

In some implementations, the top metal layer may be fabricated such that dimensions of the tracks and vias may be considerably larger (e.g. over 20 times larger) than those used in the lower layers (e.g. to form the fingers and/or to connect fingers together). In an example, in 45 nm technology, the metal pitch used for the MOM may be 0.14 μm compared to a pitch of 4 μm which may be used for the top metal layer (e.g. using an ultra thick metal layer in a RFCMOS process).

By rotating the single cell design between adjacent tiles (as shown in examples 502, 510), the number of tracks (or lines) that are required to connect to the underlying fine structured layer is reduced. As shown in FIG. 5, in a 2×2 example, only three lines in the top metal layer 511 are required where 90° rotation is used; however if adjacent tiles were not rotated four lines would be required. This reduction in the number of lines may be particularly beneficial where a CMOS process, or other process with increased minimum track widths, is used for the top metal layer.

Known Manhattan-style capacitors cannot accommodate a direct connection using a top metal layer fabricated using an IC process (examples of which include CMOS, bipolar-Si or SiGe technology, BICMOS, BCDMOS, III/V, integrated passive device) because the tracks in the MOM are too narrow to accommodate the vias.

The minimum size of a single cell 501 may be set by the design rules for the process used to create the individual metal layers. For example, for a 45 nm process, the minimum track and spacing that can be used is 70 nm. Dependent on the number of fingers, this sets a minimum size for a cell.

Although FIG. 5 shows four cells tiled in a square arrangement, it will be appreciated that this is by way of example only and more/fewer cells may be tiled to create a capacitor.

The above examples show capacitors and capacitor cells (e.g. cell 501) which are square. It will be appreciated that capacitors which are not square (e.g. rectangular capacitors) may also be fabricated using the designs described herein. Where a non-square cell (or individual capacitor) is designed, the angled feedline may be substantially diagonal, at 45° or at another angle.

As processing techniques develop, MOM capacitors having smaller minimum dimensions may be fabricated. Such capacitors will have increased parasitic resistance and therefore the benefits provided by using a diagonal (or angled) feedline as described herein may be more significant. Furthermore, as higher frequencies are used and/or more complex devices are designed (e.g. involving more radios on a single IC), the amount of decoupling which is required is likely to increase and therefore more demands will be placed on the decoupling capacitors used. The improved MOM capacitor design described herein provides a solution to such problems.

Any range or device value given herein may be extended or altered without losing the effect sought, as will be apparent to the skilled person. Aspects of any of the examples described above and shown in the figures may be combined with aspects of other examples to create yet further examples.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise and exclusive list and a method or apparatus may contain additional blocks or elements.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A metal-on-metal capacitor cell design comprising a plurality of metal layers, each metal layer comprising a design comprising:
    a first set of fingers and a second set of fingers, wherein the first set of fingers and the second set of fingers are interdigitated;
    a first peripheral finger and a second peripheral finger which is perpendicular to the first peripheral finger;
    an angled feedline between the first peripheral finger and the second peripheral finger;
    wherein the first set of fingers comprises a first subset of fingers directly connected to the angled feed line and extending towards the first peripheral finger and a second subset of fingers directly connected to the angled feedline and extending towards the second peripheral finger, wherein the first subset of fingers and the second subset of fingers encompass all fingers directly connected to the angled feedline in a metal layer,
    wherein fingers in the first subset are substantially perpendicular to fingers in the second subset,
    wherein the second set of fingers comprises a first subset of fingers connected to the first peripheral finger and extending towards the angled feedline and a second subset of fingers connected to the second peripheral finger and extending towards the angled feedline,
    wherein fingers in the first subset are substantially perpendicular to fingers in the second subset,
    wherein each metal layer in the cell design is symmetrical about a line through the angled feedline, and
    wherein the design is rotated by 180° between adjacent metal layers, said adjacent layers being interconnected with a plurality of vias, said vias only being located in fingers at a periphery of the cell.

2. A metal-on-metal capacitor cell design according to claim 1, wherein the angled feedline comprises a substantially diagonal feedline.

3. A metal-on-metal capacitor cell design according to claim 1, wherein the angled feedline is wider than any of the fingers.

4. A metal-on-metal capacitor design comprising a plurality of cells according to claim 1 arranged such that adjacent cells are rotated by 90° and further comprising a top metal layer and a plurality of vias arranged to connect each of the plurality of cells.

5. A metal-on-metal capacitor design according to claim 4, wherein the plurality of vias in the top metal layer are aligned with the angled feedline.

6. A metal-on-metal capacitor cell design according to claim 1, wherein the angled feedline comprises a diagonal feedline constructed using squares such that the diagonal feedline comprises edges of metal which are parallel to an edge of the capacitor cell.

7. A metal-on-metal capacitor comprising a capacitor cell formed from a plurality of metal layers, wherein adjacent metal layers are separated by a dielectric layer and wherein each of the metal layers in the cell comprises:
    a first set of fingers and a second set of fingers, wherein the first set of fingers and the second set of fingers are interdigitated;
    a first peripheral finger and a second peripheral finger which is perpendicular to the first peripheral finger;
    an angled feedline between the first peripheral finger and the second peripheral finger;
    wherein the first set of fingers comprises a first subset of fingers directly connected to the angled feedline and extending towards the first peripheral finger and a second subset of fingers directly connected to the angled feedline and extending towards the second peripheral finger, wherein the first subset of fingers and the second subset of fingers encompass all fingers directly connected to the angled feedline in a metal layer,
    wherein fingers in the first subset are substantially perpendicular to fingers in the second subset,
    wherein the second set of fingers comprises a first subset of fingers connected to the first peripheral finger and extending towards the angled feedline and a second subset of fingers connected to the second peripheral finger and extending towards the angled feedline,
    wherein fingers in the first subset are substantially perpendicular to fingers in the second subset,
    wherein each metal layer in the cell is symmetrical about a line through the angled feed line, and
    wherein the design is rotated by 180° between adjacent metal layers, said adjacent layers being interconnected with a plurality of vias, said vias only being located in fingers at a periphery of the cell.

8. A metal-on-metal capacitor according to claim 7, wherein the angled feedline comprises a substantially diagonal feedline.

9. A metal-on-metal capacitor according to claim 7, wherein the angled feedline is wider than any of the fingers.

10. A metal-on-metal capacitor according to claim 7, comprising a plurality of capacitor cells arranged such that adjacent cells are rotated by 90° and further comprising a top metal layer and a plurality of vias arranged to connect each of the plurality of cells.

11. A metal-on-metal capacitor according to claim 10, wherein the plurality of vias in the top metal layer are aligned with the angled feedline.

12. A metal-on-metal capacitor according to claim 7, wherein the angled feedline comprises a diagonal feedline constructed using squares such that the diagonal feedline comprises edges of metal which are parallel to an edge of the capacitor cell.

13. A metal-on-metal capacitor comprising a square capacitor cell formed from a plurality of metal layers, wherein adjacent metal layers are separated by a dielectric layer and wherein each of the metal layers in the cell comprises:
- a first set of fingers and a second set of fingers, wherein the first set of fingers and the second set of fingers are interdigitated;
- a first peripheral finger and a second peripheral finger which is perpendicular to the first peripheral finger;
- an angled feedline between the first peripheral finger and the second peripheral finger;
- wherein the first set of fingers comprises a first subset of fingers directly connected to the angled feedline and extending towards the first peripheral finger and a second subset of fingers directly connected to the angled feedline and extending towards the second peripheral finger, wherein the first subset of fingers and the second subset of fingers encompass all fingers directly connected to the angled feedline in a metal layer,
- wherein fingers in the first subset are substantially perpendicular to fingers in the second subset,
- wherein the second set of fingers comprises a first subset of fingers connected to the first peripheral finger and extending towards the angled feedline and a second subset of fingers connected to the second peripheral finger and extending towards the angled feedline,
- wherein fingers in the first subset are substantially perpendicular to fingers in the second subset,
- wherein the angled feedline is formed from squares with edges of metal which are parallel to an edge of the square cell and the square capacitor cell is symmetric about a line through the angled feedline, and
- wherein the design is rotated by 180° between adjacent metal layers, said adjacent layers being interconnected with a plurality of vias, said vias only being located in fingers at a periphery of the cell.

14. A metal-on-metal capacitor design according to claim 1 wherein each of the fingers is a straight finger.

15. A metal-on-metal capacitor according to claim 7 wherein each of the fingers is a straight finger.

16. A metal-on-metal capacitor according to claim 13 wherein each of the fingers is a straight finger.

* * * * *